(12) United States Patent
Nagasawa

(10) Patent No.: US 10,790,781 B2
(45) Date of Patent: Sep. 29, 2020

(54) SEMICONDUCTOR INTEGRATED CIRCUIT

(71) Applicants: Kabushiki Kaisha Toshiba, Minato-ku, Tokyo (JP); Toshiba Electronic Devices & Storage Corporation, Minato-ku, Tokyo (JP)

(72) Inventor: Hironori Nagasawa, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/296,600

(22) Filed: Mar. 8, 2019

(65) Prior Publication Data

US 2019/0348947 A1 Nov. 14, 2019

(30) Foreign Application Priority Data

May 14, 2018 (JP) .................. 2018-093309

(51) Int. Cl.
 *H03B 5/12* (2006.01)
 *H03B 19/20* (2006.01)
 *G05F 1/10* (2006.01)

(52) U.S. Cl.
 CPC ............ *H03B 5/1203* (2013.01); *G05F 1/10* (2013.01); *H03B 5/12* (2013.01); *H03B 5/1243* (2013.01); *H03B 19/20* (2013.01)

(58) Field of Classification Search
 CPC .... H03B 19/20; H03B 5/1243; H03B 5/1203; H03B 5/12; G05F 1/10; H03K 5/133; H03K 17/693; H03K 2005/00026; H03K 5/151; H03K 17/102; H03K 17/145; H03K 19/17732; H03K 2005/0013; H03K 2005/00208; H03K 2217/0036; H03K 2217/0054; H03K 5/13; H03K 17/063; H03K 17/122
 USPC ............................. 331/183, 16, 34; 327/536
 See application file for complete search history.

(56) References Cited

U.S. PATENT DOCUMENTS 5,122,763 A    6/1992  Saeki et al.
2015/0303794 A1* 10/2015 Molin ................ G05F 1/10
                                                    327/536

FOREIGN PATENT DOCUMENTS

| JP | H03-283820 A | 12/1991 |
| JP | 2000-245140 A | 9/2000 |
| JP | 2006-340089 A | 12/2006 |
| JP | 2008-061398 A | 3/2008 |
| JP | 2011-188323 A | 9/2011 |

\* cited by examiner

*Primary Examiner* — Arnold M Kinkead
(74) *Attorney, Agent, or Firm* — White & Case LLP

(57) ABSTRACT

According to one embodiment, there is provided a semiconductor integrated circuit including an oscillation circuit, a charge pump circuit, a smoothing circuit, and a negative feedback circuit. The charge pump circuit is arranged between each of a power supply input terminal and the oscillation circuit and a power supply output terminal. The smoothing circuit is arranged between the charge pump circuit and the power supply output terminal. The negative feedback circuit is arranged on a path returning from the smoothing circuit to the oscillation circuit. The smoothing circuit includes a first zero point generation circuit.

6 Claims, 9 Drawing Sheets

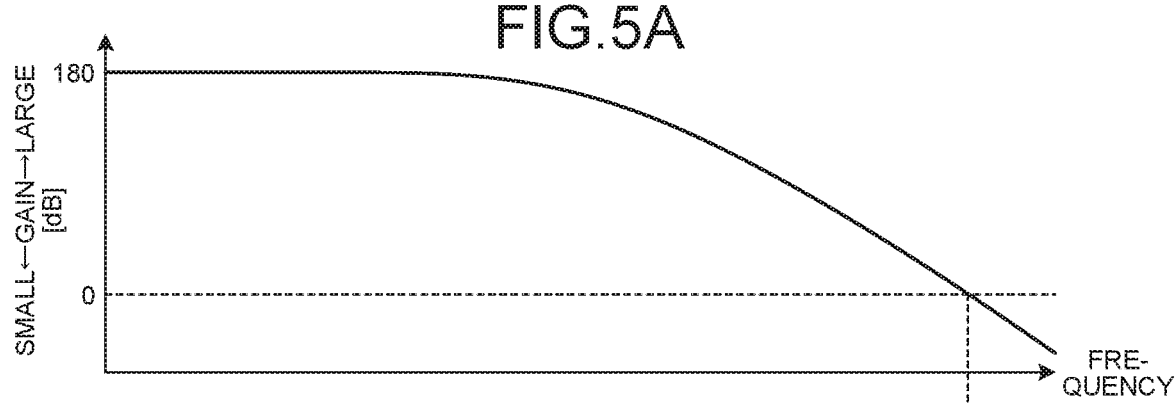
FIG.5A
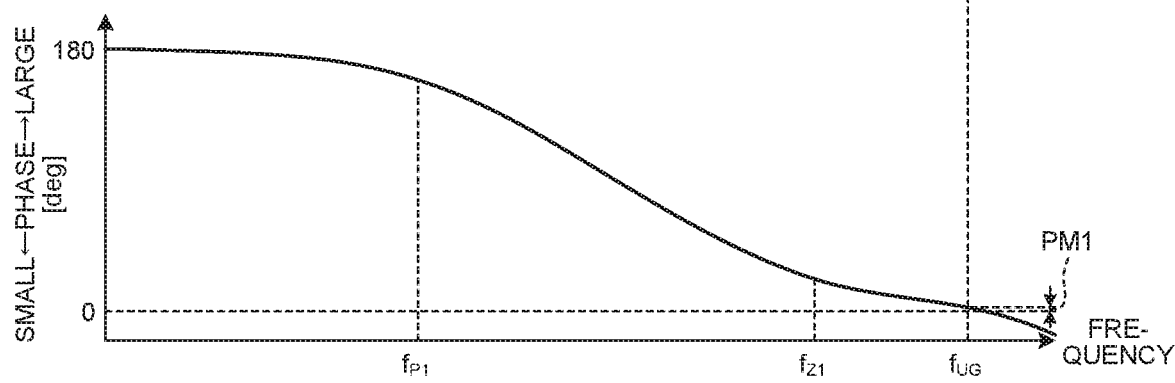
FIG.5B
FIG.6
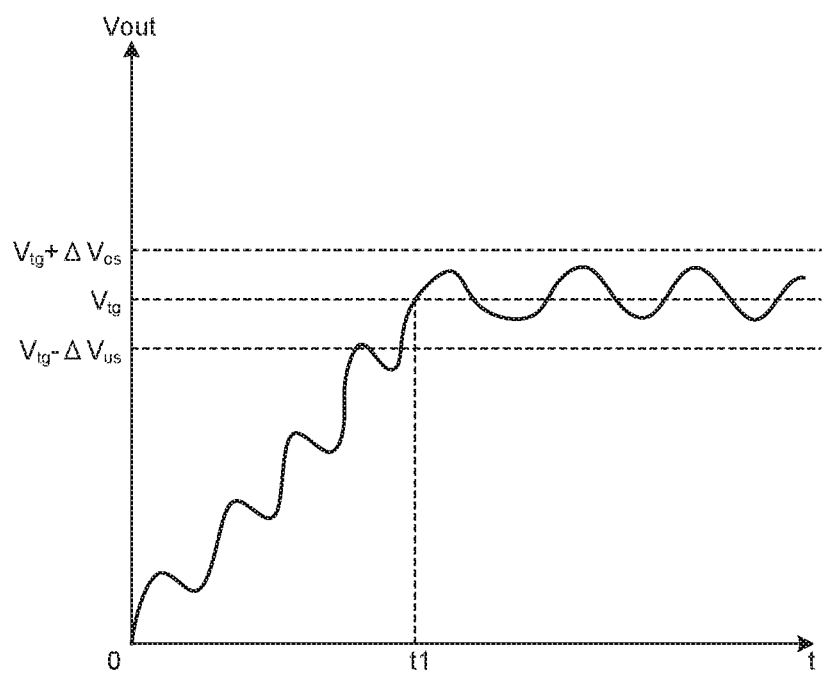

SEMICONDUCTOR INTEGRATED CIRCUIT

CROSS-REFERENCE TO RELATED APPLICATIONS

This application is based upon and claims the benefit of priority from Japanese Patent Application No. 2018-093309, filed on May 14, 2018; the entire contents of which are incorporated herein by reference.

FIELD

Embodiments described herein relate generally to a semiconductor integrated circuit.

BACKGROUND

In a semiconductor integrated circuit having a charge pump circuit and a negative feedback circuit, a voltage output from the charge pump circuit can be controlled by a negative feedback operation of the negative feedback circuit by using power received at a power supply input terminal. At this time, in order to use the semiconductor integrated circuit as a constant voltage power supply circuit, it is desirable to stabilize the negative feedback operation of the negative feedback circuit.

BRIEF DESCRIPTION OF THE DRAWINGS

FIGS. 5A and 5B are diagrams illustrating open loop frequency characteristics of the semiconductor integrated circuit according to the embodiment;

FIG. 6 is a diagram illustrating the stability of operations of the semiconductor integrated circuit according to the embodiment;

DETAILED DESCRIPTION

In general, according to one embodiment, there is provided a semiconductor integrated circuit including an oscillation circuit, a charge pump circuit, a smoothing circuit, and a negative feedback circuit. The charge pump circuit is arranged between each of a power supply input terminal and the oscillation circuit and a power supply output terminal. The smoothing circuit is arranged between the charge pump circuit and the power supply output terminal. The negative feedback circuit is arranged on a path returning from the smoothing circuit to the oscillation circuit. The smoothing circuit includes a first zero point generation circuit.

Exemplary embodiments of a semiconductor integrated circuit will be explained below in detail with reference to the accompanying drawings. The present invention is not limited to the following embodiments.

Embodiment

A semiconductor integrated circuit according to an embodiment is a circuit including a power supply circuit that adjusts (steps up or steps down) the power supply voltage. For example, a semiconductor integrated circuit is a circuit having a power supply circuit such as a step-up circuit or a step-down circuit and a feedback loop and can be used as a constant voltage power supply circuit that steps up or steps down an external power to generate a predetermined internal power.

Figure 1:
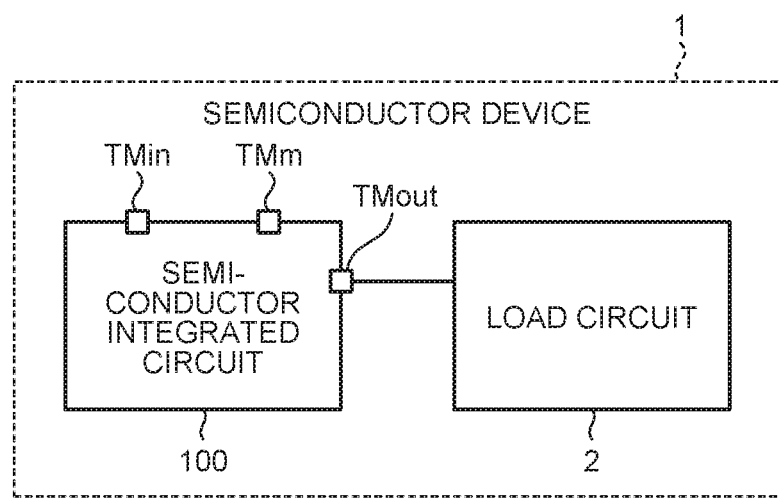
FIG. 1 is a circuit diagram illustrating a configuration of a semiconductor device including a semiconductor integrated circuit according to an embodiment.

The semiconductor device 1 including the semiconductor integrated circuit 100 can be configured, for example, as illustrated in FIG. 1. FIG. 1 is a circuit diagram illustrating a configuration of the semiconductor device 1 including the semiconductor integrated circuit 100 The semiconductor device 1 includes the semiconductor integrated circuit 100 and a load circuit 2. The semiconductor integrated circuit 100 has a power supply input terminal TMin, a monitor terminal TMm, and a power supply output terminal TMout. A power supply voltage Vdd is directly applied to the power supply input terminal TMin otherwise a power supply voltage Vdd generated in the semiconductor device 1 is applied to the TMin. The monitor terminal TMm is a terminal provided for monitoring operations of the semiconductor integrated circuit 100 and may be omitted. The power supply output terminal TMout is electrically connected to the load circuit 2 and supplies the power supply voltage Vout adjusted (stepped up or stepped down) by the semiconductor integrated circuit 100 to the load circuit 2. As a result, the load circuit 2 can operate by using the power supply voltage Vout.

Figure 2:
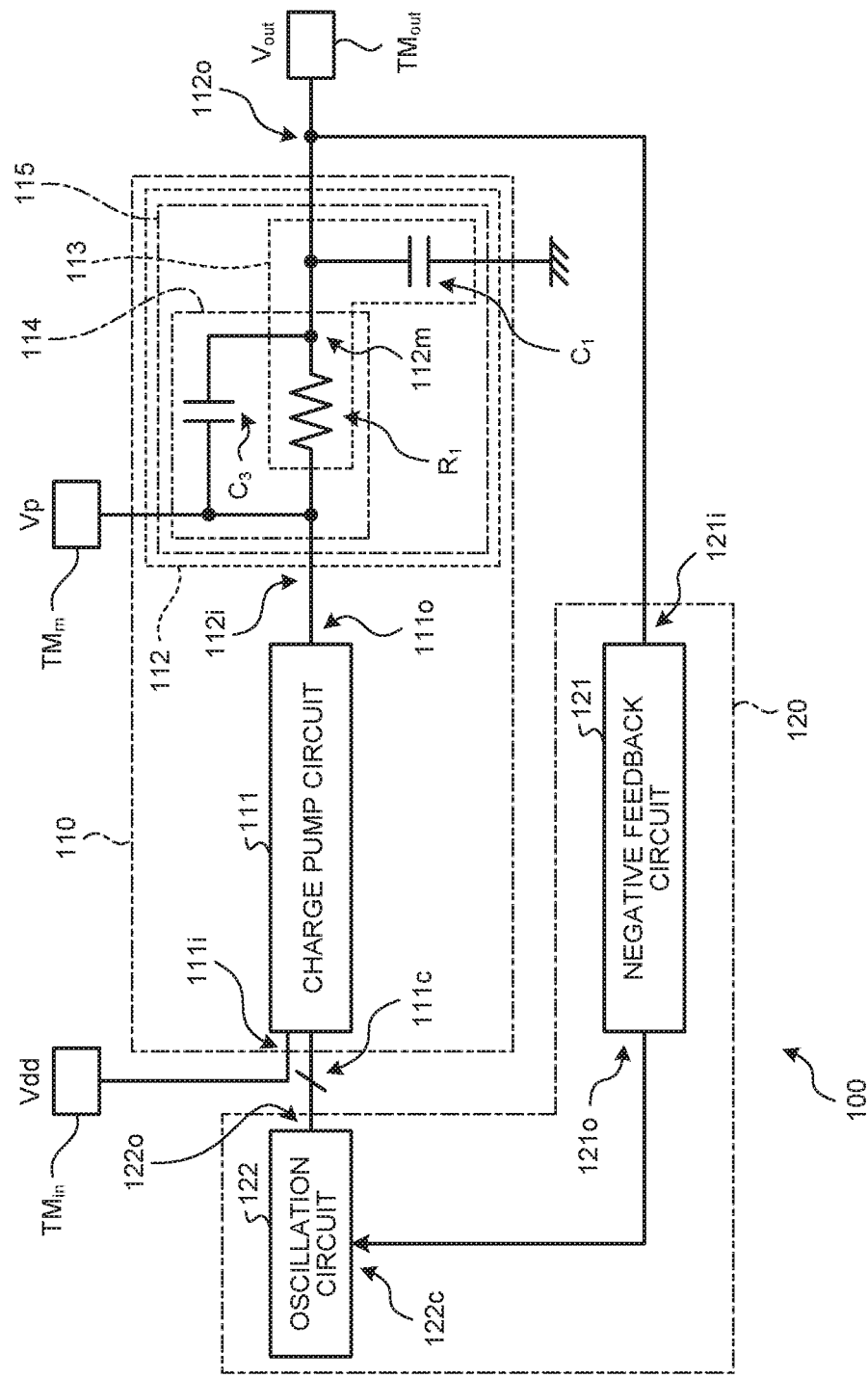
FIG. 2 is a circuit diagram illustrating a configuration of the semiconductor integrated circuit according to the embodiment.

The semiconductor integrated circuit 100 can be configured, for example, as illustrated in FIG. 2. FIG. 2 is a circuit diagram illustrating a configuration of the semiconductor integrated circuit 100. The semiconductor integrated circuit 100 includes a power supply circuit 110 and a control circuit 120. The power supply circuit 110 is arranged on a path extending from the power supply input terminal TMin to the power supply output terminal TMout. The control circuit 120 is arranged on a path (feedback loop) that returns from the power supply output terminal TMout to the power supply input terminal TMin.

The power supply circuit 110 receives the power supply voltage Vdd via the power supply input terminal TMin, adjusts (steps up or steps down) the power supply voltage, and outputs the adjusted power supply voltage Vout to the load circuit 2 via the power supply output terminal TMout. The control circuit 120 controls the power supply circuit 110 so that the power supply circuit 110 adjusts the level of the power supply voltage Vout to a predetermined target, level Vtg (refer to FIG. 6).

The power supply circuit 110 has a charge pump circuit 111 and a filter circuit (smoothing circuit) 112. The control circuit 120 has a negative feedback circuit 121 and an oscillation circuit 122.

The negative feedback circuit 121 is arranged on a path (feedback loop) returning from the filter circuit 112 to the oscillation circuit 122. The negative feedback circuit 121 has an input node 121i and an output node 121o. The input node 121i is electrically connected to the power supply output terminal TMout via the output node 112o of the filter circuit 112. The output node 121o is electrically connected to the control node 122c of the oscillation circuit 122.

The negative feedback circuit 121 can be configured with, for example, a comparator having an inverting input terminal to which a feedback voltage is supplied and a non-inverting input terminal to which a target level Vtg is supplied.

The negative feedback circuit 121 inverts the phase of the feedback voltage by about 180 degrees and outputs a signal (comparison result) indicating whether or not the level of the feedback voltage is higher than the target level Vtg. For example, the negative feedback circuit 121 compares the level of the feedback voltage with the target level Vtg. When the level of the feedback voltage is higher than the target level Vtg, the negative feedback circuit can output the comparison result of the logical low level, and when the level of the feedback voltage is lower than the target level Vtg, the negative feedback circuit can output the comparison result of the logical high level.

The oscillation circuit 122 is arranged on a path (feedback loop) returning from the negative feedback circuit 121 to the charge pump circuit 111. The oscillation circuit 122 has a control node 122c and an output node 122o. In the oscillation circuit 122, the control node 122c is electrically connected to the negative feedback circuit 121, and the output node 122o is electrically connected to the charge pump circuit 111.

The oscillation circuit 122 can be configured with a ring oscillator, which odd numbered inverters are cascaded like a ring shape, which have variable current sources or variable impedance elements which are connected to the control node 122c. In the case of receiving the comparison result of the logical high level, the oscillation circuit 122 can increase the frequency and/or the amplitude of the oscillation operation by increasing the operating current. In the case of receiving the comparison result of the logical low level, the oscillation circuit 122 can decrease the frequency and/or the amplitude of the oscillation operation.

The oscillation circuit 122 receives a signal (comparison result) from the negative feedback circuit 121 at the control node 122c, performs an oscillation operation at a frequency and/or amplitude according to the comparison result, and supplies a clock ϕCK obtained by the oscillation operation and an inverted clock ϕCKB to the charge pump circuit 111 via the output node 122o. In the case of receiving the comparison result of the logical high level, the oscillation circuit 122 increases the frequency and/or the amplitude of the oscillation operation and supplies the obtained clock ϕCK and the inverted clock ϕCKB to the charge pump circuit 111. In the case of receiving the comparison result of the logical low level, the oscillation circuit 122 decreases the frequency and/or the amplitude of the oscillation operation and supplies the obtained clock ϕCK and the inverted clock ϕCKB to the charge pump circuit 111.

The charge pump circuit 111 is arranged between each of the power supply input terminal TMin and the oscillation circuit 122 and each of the filter circuit 112 and the power supply output terminal TMout. The charge pump circuit 111 adjusts (steps up or steps down) the power supply voltage Vdd received from the power supply input terminal TMin according to the signal received from the oscillation circuit 122 and supplies the adjusted power supply voltage Vp to the filter circuit 112.

The charge pump circuit 111 has an input node 111i, a control node group 111c, and an output node 111o. In the charge pump circuit 111, the input node 111i is electrically connected to the power supply input terminal TMin, the control node group 111c is electrically connected to the oscillation circuit 122, and the output node 111o is electrically connected to the filter circuit 112.

Figure 3:
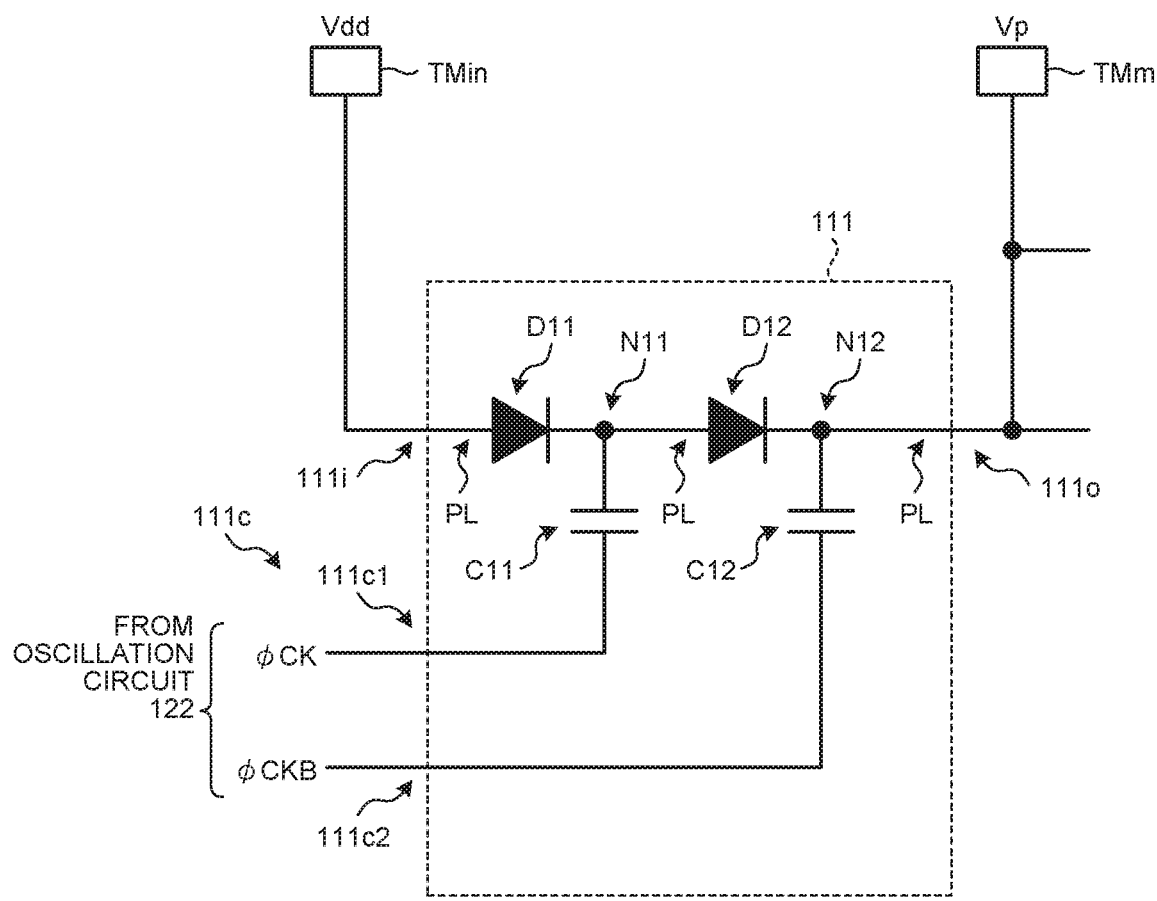
FIG. 3 is a circuit diagram illustrating a configuration example of the charge pump circuit in the embodiment.

Specifically, the charge pump circuit 111 can be configured as illustrated in FIG. 3. FIG. 3 is a circuit diagram illustrating a configuration example of the charge pump circuit 111. The charge pump circuit 111 illustrated in FIG. 3 is a circuit called a Dickson type and has a plurality of diodes D11 and D12 and a plurality of capacitive elements C11 and C12.

The plurality of diodes D11 and D12 is arranged in series on a power supply line PL extending from the input node 111i to the output node 111o. The anode of the diode D11 is electrically connected to the input node 111i, and the cathode of the diode D11 electrically connected to the node N11 on the power supply line PL. The anode of the diode D12 is electrically connected to the node N11 on the power supply line PL, and the cathode is electrically connected to the output node 111o via the node N12 on the power supply line PL.

The plurality of capacitive elements C11 and C12 is arranged in parallel between the power supply line PL and the control node group 111c. The control node group 111c includes a plurality of control nodes 111c1 and 111c2. One end of the capacitive element C11 is electrically connected to the node N11 on the power supply line PL, and the other end of the capacitive element C11 is electrically connected to the oscillation circuit 122 via the control node 111c1. One end of the capacitive element C12 is electrically connected to the node N12 on the power supply line PL, and the other end of the capacitive element C12 is electrically connected to the oscillation circuit 122 via the control node 111c2. The clock ϕCK is supplied from the oscillation circuit 122 to the control node 111c1, and the inverted clock ϕCKB is supplied from the oscillation circuit 122 to the control node 111c2. Since the clock ϕCK is a pulse-shaped signal, the clock can be transmitted from the control node 111c1 to the node N11 on the power supply line PL via the capacitive element C11. Since the inverted clock ϕCKB is a pulse-shaped signal, the inverted clock can be transmitted from the control node 111c2 to the node N12 on the power supply line PL via the capacitive element C12.

In the charge pump circuit 111 illustrated in FIG. 3, in a state where no charge is accumulated in the node N11, the diode D11 is biased with a voltage equal to or higher than the forward on voltage in the forward direction and turned on, and electric charges corresponding to the voltage according to the power supply voltage Vdd are accumulated in the node N11. In addition, the diode D12 is biased with a voltage lower than the forward on voltage in the forward direction or in the reverse direction and turned off.

When the logical high level of the clock ϕCK is supplied to the node N11 and the logical low level of the inverted clock ϕCKB is supplied to the node N12, the diode D11 is biased with a voltage lower than the forward on voltage in the forward direction or in the reverse direction and turned off, electric charges are further accumulated in the node N11 by the logical high level of the clock ϕCK, and the voltage of the node N11 is stepped up from the voltage according to the power supply voltage Vdd (for example, up to Vdd+

ΔV11). In addition, the diode D12 is biased with a voltage equal to or higher than the forward on voltage in the forward direction and turned on, and electric charges corresponding to the stepped-up voltage (Vdd+ΔV11) are accumulated in the node N12.

When the logical low level of the clock φCK is supplied to the node N11 and the logical high level of the inverted clock φCKB is supplied to the node N12, the diode D11 is biased with a voltage equal to or higher than the forward on voltage in the forward direction and turned on, and electric charges corresponding to the voltage according to the power supply voltage Vdd are accumulated in the node N11. In addition, the diode D12 is biased with a voltage lower than the forward on voltage in the forward direction or in the reverse direction and turned off, electric charges are further accumulated in the node N12 by the logical high level of the inverted clock φCKB, and the voltage of the node N12 is stepped up from the voltage according to the power supply voltage Vdd (for example, up to Vdd+□ΔV11+ΔV12). As a result, the charge pump circuit 111 supplies the stepped-up power supply voltage Vp (for example, a voltage of "Vdd+ΔV11" to "Vdd+ΔV11+ΔV12") to the filter circuit 112 via the output node 111o.

Figure 4:
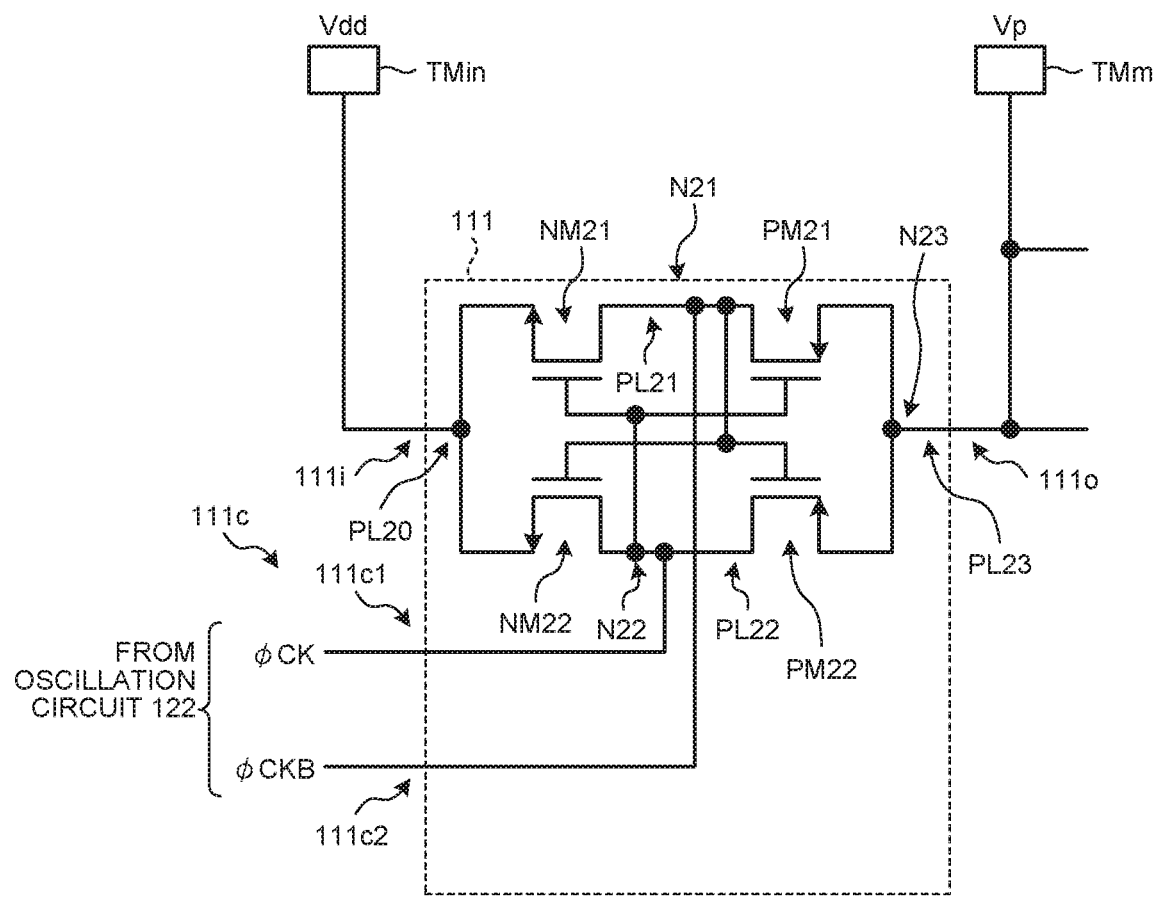
FIG. 4 is a circuit diagram illustrating another configuration example of the charge pump circuit in the embodiment.

Alternatively, the charge pump circuit 111 can be configured as illustrated in FIG. 4. FIG. 4 is a circuit diagram illustrating another configuration example of the charge pump circuit 111. The charge pump circuit 111 illustrated in FIG. 4 is a circuit called a synchronous rectification type and has a plurality of transistors NM21, NM22, PM21, and PM22.

On a path extending from the input node 111i to the output node 111o, a power supply line PL20 is branched to two power supply lines PL21 and PL22 which are parallel to each other, and then, the two power supply lines are merged into a power supply line PL23. The plurality of transistors NM21 and PM21 is arranged in series on the power supply line PL21 extending from the input node 111i to the output node 111o. The plurality of transistors NM22 and PM22 is arranged in series on the power supply line PL22 extending from the input node 111i to the output node 111o. The plurality of transistors NM22 and PM22 is arranged in parallel to the plurality of transistors NM21 and PM21 between the input node 111i and the output node 111o.

The transistor NM21 can be configured with an NMOS transistor. The gate of the transistor NM21 is electrically connected to the gate of the transistor PM21 and a node N22 on the power supply line PL22, the source of the transistor NM21 is electrically connected to the input node 111i, and the drain of the transistor NM21 is electrically connected to the node N21 on the power supply line PL21. The transistor PM21 can be configured with a PMOS transistor. The gate of the transistor PM21 is electrically connected to the gate of the transistor NM21 and the node N22 on the power supply line PL22, the source of the transistor PM21 is electrically connected to the node N21 on the power supply line PL21, and the drain of the transistor PM21 is electrically connected to the output node 111o via a node N23.

The transistor NM22 can be configured with an NMOS transistor. The gate of the transistor NM22 is electrically connected to the gate of the transistor PM22 and the node N21 on the power supply line PL21 on the power supply line PL21, the source of the transistor NM22 is electrically connected to the input node 111i, and the drain of the transistor NM22 is electrically connected to the node N22 on the power supply line PL22. The transistor PM22 can be configured with a PMOS transistor. The gate of the transistor PM22 is electrically connected to the gate of the transistor NM22 and the node N21 on the power supply line PL21, the source of the transistor PM22 is electrically connected to the node N22 on the power supply line PL22, and the drain of the transistor PM22 is electrically connected to the output node 111o via the node N23.

The control node group 111c includes the plurality of control nodes 111c1 and 111c2. The control node 111c1 is electrically connected to the node N22 on the power supply line PL22. The control node 111c2 is electrically connected to the node N21 on the power supply line PL21. The clock φCK is supplied from the oscillation circuit 122 to the control node 111c1, and the inverted clock φCKB is supplied from the oscillation circuit 122 to the control node 111c2.

In the charge pump circuit 111 illustrated in FIG. 4, when the logical high level of the clock φCK is supplied to the node N22 and the logical low level of the inverted clock φCKB is supplied to the node N21, the transistor NM21 is turned on and the transistor PM21 is turned off in the power supply line PL21, and electric charges corresponding to the voltage according to the power supply voltage Vdd are accumulated in the node N21. At this time, the transistor NM22 in the power supply line PL22 is turned off.

When the logical low level of the clock φCK is supplied to the node N22 and the logical high level of the inverted clock φCKB is supplied to the node N21, the transistor NM22 is turned on and the transistor PM22 is turned off in the power supply line PL22, and electric charges corresponding to the voltage according to the power supply voltage Vdd are accumulated in the node N22. At this time, the transistor NM21 in the power supply line PL21 is turned off, the electric charges are further accumulated in the node N21 by the logical high level of the inverted clock φCKB, the voltage of the node N21 is stepped up from the voltage according to the power supply voltage Vdd (for example, up to Vdd+ΔV21), the transistor PM21 is turned on, and electric charges corresponding to the stepped-up voltage (Vdd+ΔV21) are accumulated in the node N23.

When the logical high level of the clock φCK is supplied to the node N22 and the logical low level of the inverted clock φCKB is supplied to the node N21, the transistor NM21 is turned on and the transistor PM21 is turned off in the power supply line PL21, and electric charges corresponding to the voltage according to the power supply voltage Vdd are accumulated in the node N21 again. At this time, the transistor NM22 in the power supply line PL22 is turned off, electric charges are further accumulated in the node N22 by the logical high level of the clock φCK, the voltage of the node N22 is stepped up from the voltage according to the power supply voltage Vdd (for example, up to Vdd+ΔV22), the transistor PM22 is turned on, and electric charges corresponding to the stepped-up voltage (Vdd+ΔV22) are accumulated in the node N23.

Returning to FIG. 2, since the charge pump circuit 111 is controlled by pulses (clock φCK and inverted clock φCKB) from the oscillation circuit 122, the amplitude of the output power supply voltage Vp can vary with time (refer to FIG. 6). However, in consideration of ease of use in the load circuit 2 (refer to FIG. 1), it is desirable that time variation of the power supply voltage Vp is suppressed.

In order to suppress time variation of the power supply voltage Vp, the filter circuit (smoothing circuit) 112 is arranged between the charge pump circuit 111 and the power supply output terminal TMout. The filter circuit 112 smoothes the power supply voltage Vp supplied from the charge pump circuit 111 and supplies the smoothed power supply voltage Vout to the power supply output terminal TMout.

The filter circuit 112 has an input node 112*i* and an output node 112*o*. The input node 112*i* is electrically connected to the charge pump circuit 111. The output node 112*o* is electrically connected to each of the power supply output terminal TMout and the negative feedback circuit 121.

Specifically, the filter circuit 112 has a low-pass filter 113. The low-pass filter 113 has a resistive element $R_1$ and a capacitive element $C_1$.

The resistive element $R_1$ is arranged between the charge pump circuit 111 and the power supply output terminal TMout. One end of the resistive element $R_1$ is electrically connected to the charge pump circuit 111 via the input node 112*i*, and the other end of the resistive element $R_1$ is electrically connected to one end of the capacitive element $C_1$ and is electrically connected to the power supply output terminal TMout via the output node 112*o*.

The capacitive element $C_1$ is arranged between the resistive element $R_1$ and the power supply output terminal TMout. The capacitive element $C_1$ is shunt-connected to the path extending from the input node 112*i* through the resistive element $R_1$ to the output node 112*o*. One end of the capacitive element $C_1$ is electrically connected to the other end of the resistive element $R_1$ and the output node 112*o*, and the other end of the capacitive element $C_1$ is electrically connected to the ground potential.

In the semiconductor integrated circuit 100, the power supply voltage Vp adjusted (stepped up or stepped down) by the charge pump circuit 111 is smoothed by the filter circuit 112 and is output as the power supply voltage Vout from the power supply output terminal TMout to the load circuit 2 and is fed back to the negative feedback circuit 121. The power supply voltage Vout fed back to the negative feedback circuit 121 is referred to as a feedback voltage.

In a case where the level of the feedback voltage Vout is lower than the target level Vtg, the negative feedback circuit 121 outputs an logical high level signal to the oscillation circuit 122. In response to this, the oscillation circuit 122 increases the frequency and/or the amplitude of the oscillation operation and supplies the obtained clock φCK and the inverted clock φCKB to the charge pump circuit 111. Since the charge pump circuit 111 receives the clock φCK and the inverted clock φCKB having the increased frequency and/or amplitude, the charge pump circuit can increase the output voltage Vp.

In a case where the level of the feedback voltage Vout is higher than the target level Vtg, the negative feedback circuit 121 outputs an logical low level signal to the oscillation circuit 122. In response to this, the oscillation circuit 122 decreases the frequency and/or the amplitude of the oscillation operation and supplies the obtained clock φCK and the inverted clock φCKB to the charge pump circuit 111. Since the charge pump circuit 111 receives the clock φCK and the inverted clock ΔCKB having the decreased frequency and/or amplitude, the charge pump circuit can reduce the output voltage Vp.

According to these operations, the level of the output voltage Vp of the charge pump circuit 111 can be controlled so as to be close to the target level Vtg. Therefore, it can be considered that, by smoothing the output voltage Vp by the filter circuit 112, the level of the power supply voltage Vout output from the power supply output terminal TMout can be stabilized so as to be within a predetermined required range.

However, with respect to the negative feedback loop in the semiconductor integrated circuit 100, when an open-loop transfer function is considered, this open-loop transfer function is the complex number quantity of the gain and the phase. Considering the frequency characteristic, with respect to the phase margin (PM), which is defined at unity gain frequency (i.e., the frequency when the gain becomes 1, that is, 0 dB) $f_{UG}$, when the phase margin (PM)=180°−(the deviation from the phase at the low frequency)<0, this system is likely to be unstable.

That is, when the parasitic capacitance of the load circuit 2 connected to the power supply output terminal TMout of the semiconductor integrated circuit 100 increases, poles in the frequency characteristic are likely to be formed at the frequency lower than the unity gain frequency $f_{UG}$ by the parasitic capacitance in the load circuit 2, the parasitic resistance and the parasitic capacitance in the negative feedback circuit 121, and the resistive element $R_1$ and the capacitive element $C_1$ in the filter circuit 112. As a result, the phase of open loop characteristic of the semiconductor integrated circuit 100 rotates in the minus direction on the frequency lower than the unity gain frequency $f_{UG}$, and the phase margin at the unity gain frequency $f_{UG}$ is likely to become negative (likely to be PM<0). That is, the negative feedback operation in the semiconductor integrated circuit 100 is likely to be unstable.

On the other hand, when the resistance value of the resistive element $R_1$ and the capacitance value of the capacitive element $C_1$ in the filter circuit 112 are decreased, the pole frequency can be shifted to the higher frequency side than the unity gain frequency $f_{UG}$. However, in this case, since the cutoff frequency of the low-pass filter 113 is increased, the smoothing performance of the power supply voltage Vp is likely to deteriorate, and it becomes difficult to stabilize the level of the power supply voltage Vout output from the power supply output terminal TMout so as to be within a predetermined required range. When the level of the power supply voltage Vout deviates from a predetermined required range and hunting is large, there is a possibility that the load circuit 2 which is the supply destination of the power supply voltage Vout malfunctions.

Therefore, in the embodiment, in the semiconductor integrated circuit 100, a circuit for forming the zero point in the frequency characteristic on the lower frequency side than the unity gain frequency $f_{UG}$ is provided in the filter circuit 112, so that the improvement of the smoothing performance of the power supply voltage and the improvement of the stability of the negative feedback operation can be simultaneously achieved.

Specifically, as illustrated in FIG. 2, the filter circuit 112 has a zero point generation circuit 114 and a pole generation circuit 115. The zero point generation circuit 114 is arranged between the charge pump circuit 111 and the power supply output terminal TMout.

The zero point generation circuit 114 has the resistive element (first resistive element) $R_1$ and a capacitive element (first capacitive element) $C_3$. The pole generation circuit 115 has the resistive element $R_1$, the capacitive element $C_3$, and the capacitive element $C_1$. The zero point generation circuit 114 and the pole generation circuit 115 share the resistive element $R_1$ and the capacitive element $C_3$ with each other. The zero point generation circuit 114 shares the resistive element $R_1$ with the low-pass filter 113. The pole generation circuit 115 includes the low-pass filter 113.

The capacitive element $C_3$ is arranged in parallel to the resistive element $R_1$ between the charge pump circuit 111 and the power supply output terminal TMout. The resistive element $R_1$ and the capacitive element $C_3$ are connected in parallel to each other between the input node 112*i* and the intermediate node 112*m*. One end of the capacitive element $C_3$ is electrically connected to the charge pump circuit 111 via the input node 112*i*, and the other end of the capacitive element $C_3$ is electrically connected to the power supply output terminal TMout via the intermediate node 112*m* and the output node 112*o*.

More specifically, in a case where the parasitic capacitance in the load circuit 2 (refer to FIG. 1) and the parasitic resistance and the parasitic capacitance in the negative feedback circuit 121 can be neglected, the open-loop transfer function of the negative feedback loop of the charge pump circuit 111→the filter circuit 112→the negative feedback circuit 121→the oscillation circuit 122→the charge pump circuit 111 can be expressed approximately by the following Mathematical Formula 1.

$$G(s) = \frac{C_3}{C_1 + C_3} \cdot \frac{s + \frac{1}{C_3 R_1}}{s + \frac{1}{(C_1 + C_3)R_1}} \quad (1)$$

From Mathematical Formula 1, the frequency $f_{z1}$ of the zero point generated by the zero point generation circuit 114 can be expressed by the following Mathematical Formula 2, and the frequency $f_{P1}$ of the pole generated by the pole generation circuit 115 can be expressed by the following Mathematical Formula 3.

$$f_{Z1} = \frac{1}{2\pi C_3 \times R_1} \quad (2)$$

$$f_{P1} = \frac{1}{2\pi (C_1 + C_3) \times R_1} \quad (3)$$

It can be understood from Mathematical Formula 2 that by adjusting the capacitance value of the capacitive element $C_3$ without decreasing the resistance value of the resistive element $R_1$, it is possible to locate the frequency $f_{z1}$ of the zero point on the lower frequency side than the unity gain frequency $f_{UG}$. At this time, according to Mathematical Formula 3, the frequency $f_{P1}$ of the pole is located on the lower frequency side than the frequency $f_{z1}$ of the zero point.

For example, the frequency characteristic of the semiconductor integrated circuit 100 is illustrated in FIG. 5. FIG. 5A illustrates the frequency characteristic of the gain of the semiconductor integrated circuit 100, and FIG. 5B illustrates the frequency characteristic of the phase of the semiconductor integrated circuit 100. In FIG. 5A, the vertical axis represents the magnitude of the gain [dB], and the horizontal axis represents the magnitude of the frequency in log scale. In FIG. 5B, the vertical axis represents the magnitude of the phase [deg] by arctan Vout/Vin), and the horizontal axis represents the magnitude of the frequency in log scale.

The frequency at which the gain=0 [dB] in the frequency characteristic of the gain in FIG. 5A can be defined as a unity gain frequency $f_{UG}$. As illustrated in the frequency characteristic of the phase illustrated in FIG. 5B, the next relationship can be obtained.

The relationship is as follows: Frequency of Pole $f_{P1}$<Frequency of Zero Point $f_{z1}$<Unity Gain Frequency $f_{UG}$.

The frequency characteristic of the phase rotates to the minus side in the vicinity of the frequency $f_{P1}$ of the pole (the phase lags), and the frequency characteristic of the phase rotates to the plus side at the frequency $f_{z1}$ of the zero point (the lagging of the phase is mitigated), so the phase margin PM1 at the unity gain frequency $f_{UG}$ can be allowed to a positive value (PM1>0). For example, in a case where $R_1$=20 [kΩ], $C_1$=50 [pF], and $C_3$=2 [pF], the frequency of the pole becomes 0.153 [MHz], the frequency of the zero point becomes 3.98 [MHz], and the phase margin PM1 becomes PM1≈+0.25 [deg].

As illustrated in FIGS. 5A and 5B, the zero point acts to offset the pole, so the phase margin can be restored to a positive value, and as illustrated in FIG. 6, for example, at the time of start up of the semiconductor integrated circuit 100, the settling operation of the power supply voltage Vout can be stabilized. That is, at the time of start up of the semiconductor integrated circuit 100, the power supply voltage Vout can be controlled so as to satisfy the Mathematical Formula 4 after the timing t1 at which the power supply voltage Vout reaches the target level Vtg.

$$Vtg - \Delta V_{US} < Vout < Vtg + \Delta V_{CS} \quad (4)$$

In Mathematical Formula 4, $\Delta V_{US}$ (>0) represents an allowable undershoot amount with respect to the target level Vtg, and $\Delta V_{CS}$ (>0) represents an allowable overshoot amount with respect to the target level Vtg. That is, the level of the power supply voltage Vout can be stabilized so as to be within a predetermined required range, and thus, the negative feedback operation of the negative feedback loop in the semiconductor integrated circuit 100 can be stabilized.

As described above, in the embodiment, in the semiconductor integrated circuit 100, the circuit for forming the zero point in the frequency characteristic on the lower frequency side than the unity gain frequency $f_{UG}$ is provided in the filter circuit 112. Therefore, it is possible to simultaneously achieve the improvement of the smoothing performance of the power supply voltage and the improvement of the stability of the negative feedback operation. That is, the stability of the negative feedback loop can be improved while maintaining the smoothing performance for the charge pump output (Vp) at a required level.

In addition, in the semiconductor integrated circuit 100, at least one of the pole frequencies generated by the filter circuit 112 can be allowed to be ⅕ times or less of the fundamental wave frequency of the waveform output by the oscillation circuit 122. As a result, although the phase characteristic of the semiconductor integrated circuit 100 rotates in the minus direction on the considerably lower frequency side than the unity gain frequency $f_{UG}$, the phase margin can be restored to a positive value by applying this embodiment.

Alternatively, in the semiconductor integrated circuit 100, the zero point frequency generated by the filter circuit 112 may be 5 times or more and 200 times or less of the pole frequency. In this case, by applying this embodiment, it is possible to locate the frequency $f_{z1}$ of the zero point on the lower frequency side than the unity gain frequency $f_{UG}$, and thus, the phase margin can be restored to a positive value.

Alternatively, in the embodiment, a case where one zero point is formed in the frequency characteristic of the semiconductor integrated circuit is exemplified. However, it is considered that, if a plurality of zero points is formed in the frequency characteristic of the semiconductor integrated circuit, the phase margin in the frequency characteristic of the semiconductor integrated circuit can be further increased, and the negative feedback operation can be further stabilized.

Figure 7:
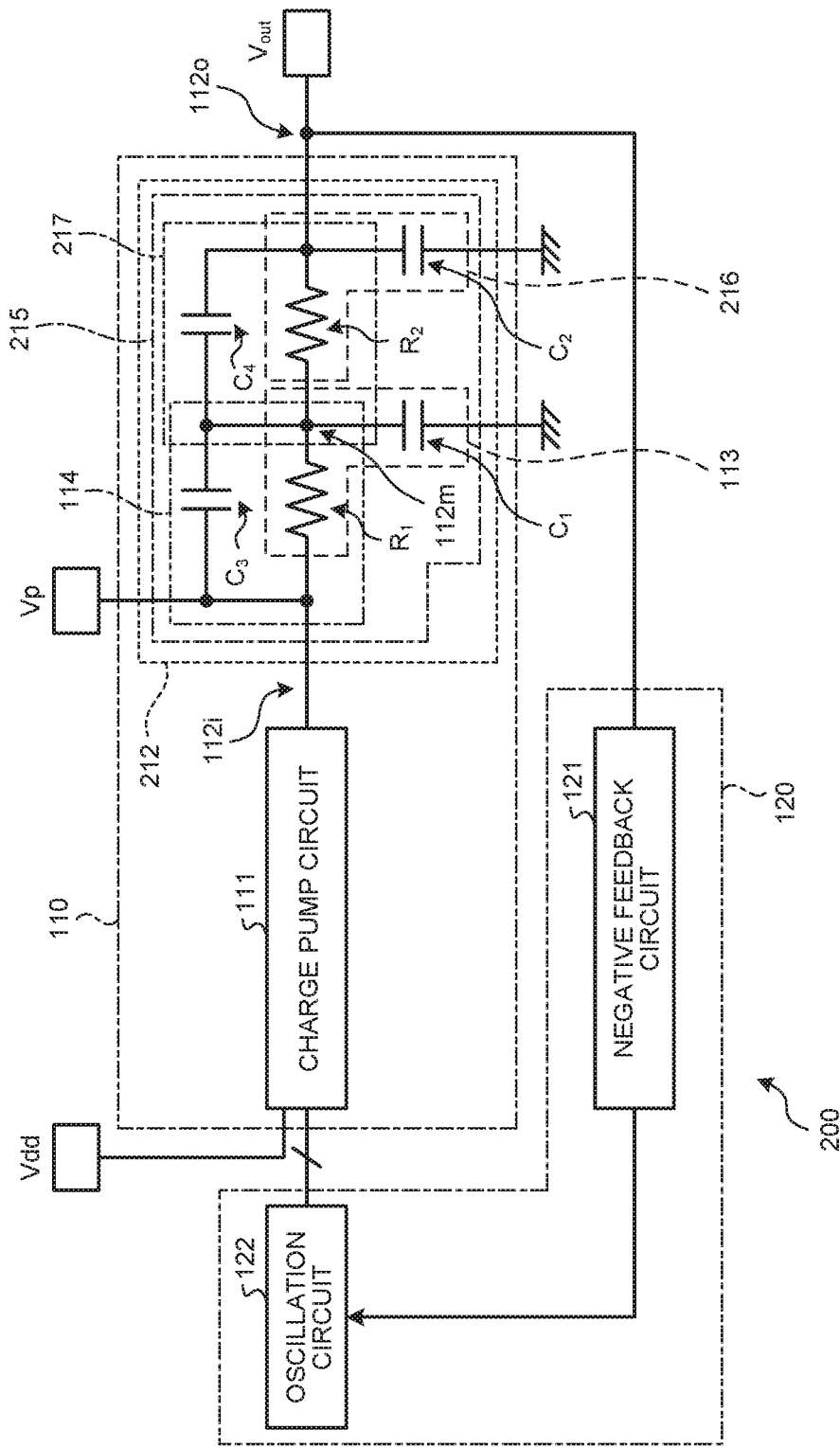
FIG. 7 is a circuit diagram illustrating a configuration of a semiconductor integrated circuit according to Modified Example of the embodiment.

On the basis of the idea, the semiconductor integrated circuit 200 can be configured, for example, as illustrated in FIG. 7. FIG. 7 is a circuit diagram illustrating a configuration of the semiconductor integrated circuit 200 according to Modified Example of the embodiment.

The semiconductor integrated circuit 200 illustrated in FIG. 7 has a filter circuit 212 instead of the filter circuit 112 (refer to FIG. 2). In the filter circuit 212, the zero point generation circuits are arranged in a two-stage configuration between the charge pump circuit 111 and the power supply output terminal TMout. That is, the filter circuit 212 further includes a low-pass filter 216 and a zero point generation circuit (second zero point generation circuit) 217 and is different in terms of the configuration of the pole generation circuit 215.

The low-pass filter 216 is arranged between the low-pass filter 113 and the power supply output terminal TMout. The low-pass filter 216 has a resistive element $R_2$ and a capacitive element $C_2$. The resistive element $R_2$ is arranged between the low-pass filter 113 and the power supply output terminal TMout. One end of the resistive element $R_2$ is electrically connected to the other end of the resistive element $R_1$ and one end of the capacitive element $C_1$, and the other end of the resistive element $R_2$ is electrically connected to one end of the capacitive element $C_2$ and is electrically connected to the power supply output terminal TMout via the output node 112o.

The capacitive element $C_2$ is arranged between the resistive element $R_2$ and the power supply output terminal TMout. The capacitive element $C_2$ is shunt-connected to a path extending from the input node 112i through the resistive elements $R_1$ and $R_2$ to the output node 112o. One end of the capacitive element $C_2$ is electrically connected to the other end of the resistive element $R_2$ and the output node 112o, and the other end of the capacitive element $C_2$ is electrically connected to the ground potential.

The zero point generation circuit 114 is arranged between the charge pump circuit 111 and the zero point generation circuit 217. The zero point generation circuit 217 is arranged between the zero point generation circuit 114 and the power supply output terminal TMout. The zero point generation circuit 217 has the resistive element (second resistive element) $R_2$ and a capacitive element (second capacitive element) $C_4$. The pole generation circuit 215 has the resistive element $R_1$, the resistive element $R_2$, the capacitive element $C_3$, the capacitive element $C_1$, the capacitive element $C_4$, and the capacitive element $C_2$. The zero point generation circuit 114 and the pole generation circuit 215 share the resistive element $R_1$ and the capacitive element $C_3$ with each other. The zero point generation circuit 217 and the pole generation circuit 215 share the resistive element $R_2$ and the capacitive element $C_4$ with each other. The zero point generation circuit 114 shares the resistive element $R_1$ with the low-pass filter 113. The zero point generation circuit 217 shares the resistive element $R_2$ with the low-pass filter 216. The pole generation circuit 215 includes low-pass filters 113 and 216.

The capacitive element $C_4$ is arranged in parallel to the resistive element $R_2$ between the charge pump circuit 111 and the power supply output terminal TMout. The resistive element $R_2$ and the capacitive element $C_4$ are connected in parallel to each other between the intermediate node 112m and the output node 112o. One end of the capacitive element $C_4$ is electrically connected to the zero point generation circuit 114 via the intermediate node 112m, and the other end of the capacitive element $C_4$ is electrically connected to the power supply output terminal TMout via the output node 112o.

More specifically, in a case where the parasitic capacitance in the load circuit 2 (refer to FIG. 1) and the parasitic resistance and the parasitic capacitance in the negative feedback circuit 121 can be neglected, the open-loop transfer function of the negative feedback loop of the charge pump circuit 111→the filter circuit 212→the negative feedback circuit 121→the oscillation circuit 122→the charge pump circuit 111 can be expressed approximately by the following Mathematical Formula 5.

$$G(s) = \frac{C_3 C_4}{(C_1 + C_3)(C_2 + C_4) + C_2 C_4} \times \frac{\left(s + \frac{1}{C_3 R_1}\right)\left(s + \frac{1}{C_4 R_2}\right)}{s^2 + s\frac{(C_1 + C_3)R_1 + (C_2 + C_4)R_2 + C_2 R_1}{\{(C_1 + C_3)(C_2 + C_4) + C_2 C_4\}R_1 R_2} + \frac{1}{\{(C_1 + C_3)(C_2 + C_4) + C_2 C_4\}R_1 R_2}} \quad (5)$$

From Mathematical Formula 5, the frequency $f_{z11}$ of the zero point generated by the zero point generation circuit 114 can be expressed by the following Mathematical Formula 6, and the frequency $f_{z12}$ of the zero point generated by the zero point generation circuit 217 can be expressed by the following Mathematical Formula 7.

$$f_{Z11} = \frac{1}{2\pi C_3 \times R_1} \quad (6)$$

$$f_{Z12} = \frac{1}{2\pi C_4 \times R_2} \quad (7)$$

In addition, by inserting the variables $\alpha$ and $\beta$ expressed by the following Mathematical Formula 8 into Mathematical Formula 5, the frequencies $f_{P11}$ and $f_{P12}$ of the two poles generated by the pole generation circuit 215 can be expressed by the following Mathematical Formulas 9 and 10, respectively.

$$\alpha = \frac{(C_1 + C_3)R_1 + (C_2 + C_4)R_2 + C_2 R_1}{\{(C_1 + C_3)(C_2 + C_4) + C_2 C_4\}R_1 R_2}, \quad (8)$$

$$\beta = \frac{1}{\{(C_1 + C_3)(C_2 + C_4) + C_2 C_4\}R_1 R_2}$$

$$f_{P11} = \frac{1}{4\pi}[\alpha + \sqrt{\alpha^2 - 4\beta}] \quad (9)$$

$$f_{P12} = \frac{1}{4\pi}[\alpha - \sqrt{\alpha^2 - 4\beta}] \quad (10)$$

It can be understood from Mathematical Formula 6 that, by adjusting the capacitance value of the capacitive element $C_3$ without decreasing the resistance value of the resistive element $R_1$, the frequency $f_{z11}$ of the zero point can be located on the lower frequency side than the unity gain frequency $f_{UG}$. It can be understood from Mathematical Formula 7 that, by adjusting the capacitance value of the capacitive element $C_4$ without decreasing the resistance value of the resistive element $R_2$, the frequency $f_{z12}$ of the zero point can be located on the lower frequency side than the unity gain frequency $f_{UG}$. At this time, according to the Mathematical Formulas 8 to 10, the frequencies $f_{P11}$ and $f_{P12}$ of the two poles are located on the lower frequency side than the frequencies $f_{z11}$ and $f_{z12}$ of the two zero points, respectively.

For example, the frequency characteristics of the semiconductor integrated circuit 200 are illustrated in FIG. 8.

Figure 8A:
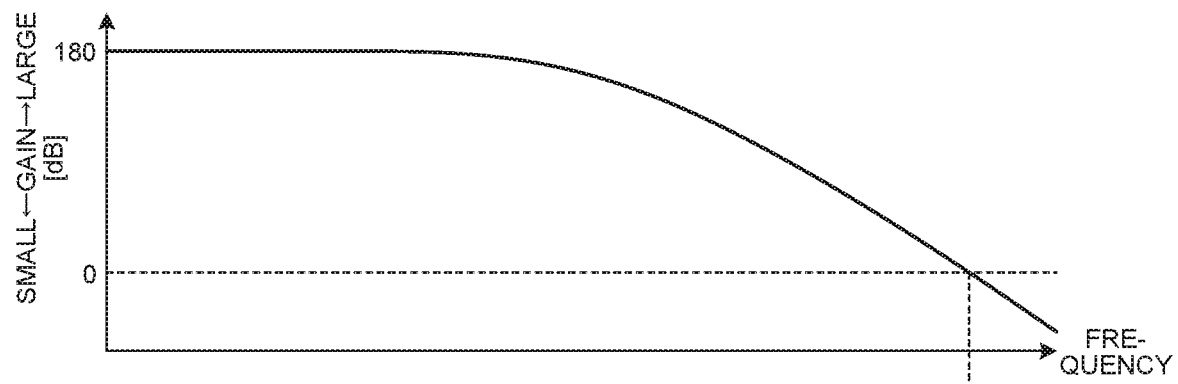
FIGS. 8A and 8B are diagrams illustrating open loop frequency characteristics of the semiconductor integrated circuit according to Modified Example of the embodiment.
Figure 8B:
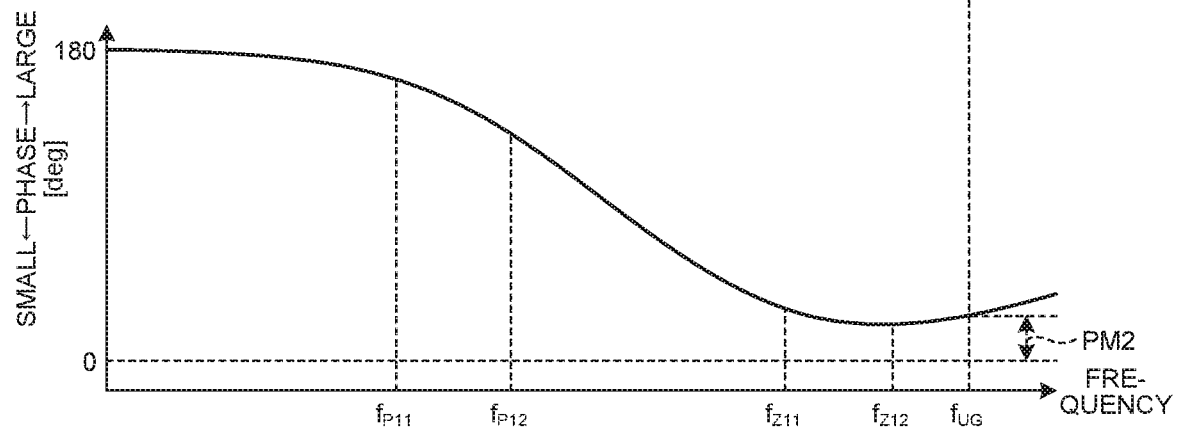

FIG. 8A illustrates the frequency characteristic of the gain of the semiconductor integrated circuit 200, and FIG. 8B illustrates the frequency characteristic of the phase of the semiconductor integrated circuit 200. In FIG. 8A, the vertical axis represents the magnitude of the gain [dB], and the horizontal axis represents the magnitude of the frequency in log scale. In FIG. 8B, the vertical axis represents the magnitude of the phase [deg] by arctan (Vout/Vin), and the horizontal axis represents the magnitude of the frequency in log scale.

The frequency at which the gain=0 [dB] in the frequency characteristic of the gain in FIG. 8A can be defined as a unity gain frequency $f_{UG}$. As illustrated in the frequency characteristic of the phase illustrated in FIG. 8B, the following relationship can be obtained.

Frequency of Pole $f_{P11}$<Frequency of Pole $f_{P12}$<Frequency of Zero Point $f_{z11}$<Frequency of Zero Point $f_{z12}$<Unity Gain Frequency $f_{UG}$ The frequency characteristic of the phase rotates to the minus side at the frequency $f_{P11}$ of the pole and further rotates to the minus side at the frequency $f_{P12}$ of the pole (the phase lags), and the frequency characteristic of the phase rotates to the plus side at the frequency $f_{z11}$ of the zero point and further rotates to the plus side at the frequency $f_{z12}$ of the zero point (the lagging of the phase is mitigated), so that the phase margin PM2 at the unity gain frequency $f_{UG}$ can be allowed to be easily increased to a positive value (PM2>0). For example, in a case where $C_1$=5 [pF], $C_2$=50 [pF], $C_3$=1 [pF], $C_4$=2 [pF], $R_1$=20 [kΩ], and $R_2$=30 [kΩ], the phase margin PM2 becomes PM2≈+30.6 [deg].

As illustrated in FIGS. 8A and 8B, by generating a plurality (for example, two) of zero points that act to offset the poles, it is possible to further strengthen the effect of mitigating the leading of the phase. Therefore, the phase margin in the frequency characteristic of the semiconductor integrated circuit 200 can be further increased, and the negative feedback operation can be further stabilized. As a result, the degree of freedom of the load circuit 2 connected to the power supply output terminal TMout of the semiconductor integrated circuit 200 can be increased.

Alternatively, in Modified Example, a plurality of zero point generation circuits is provided in the filter circuit so as to form a plurality of zero points. However, it can be considered that a plurality of zero points can also be formed by changing the configuration of the zero point generation circuit itself.

Figure 9:
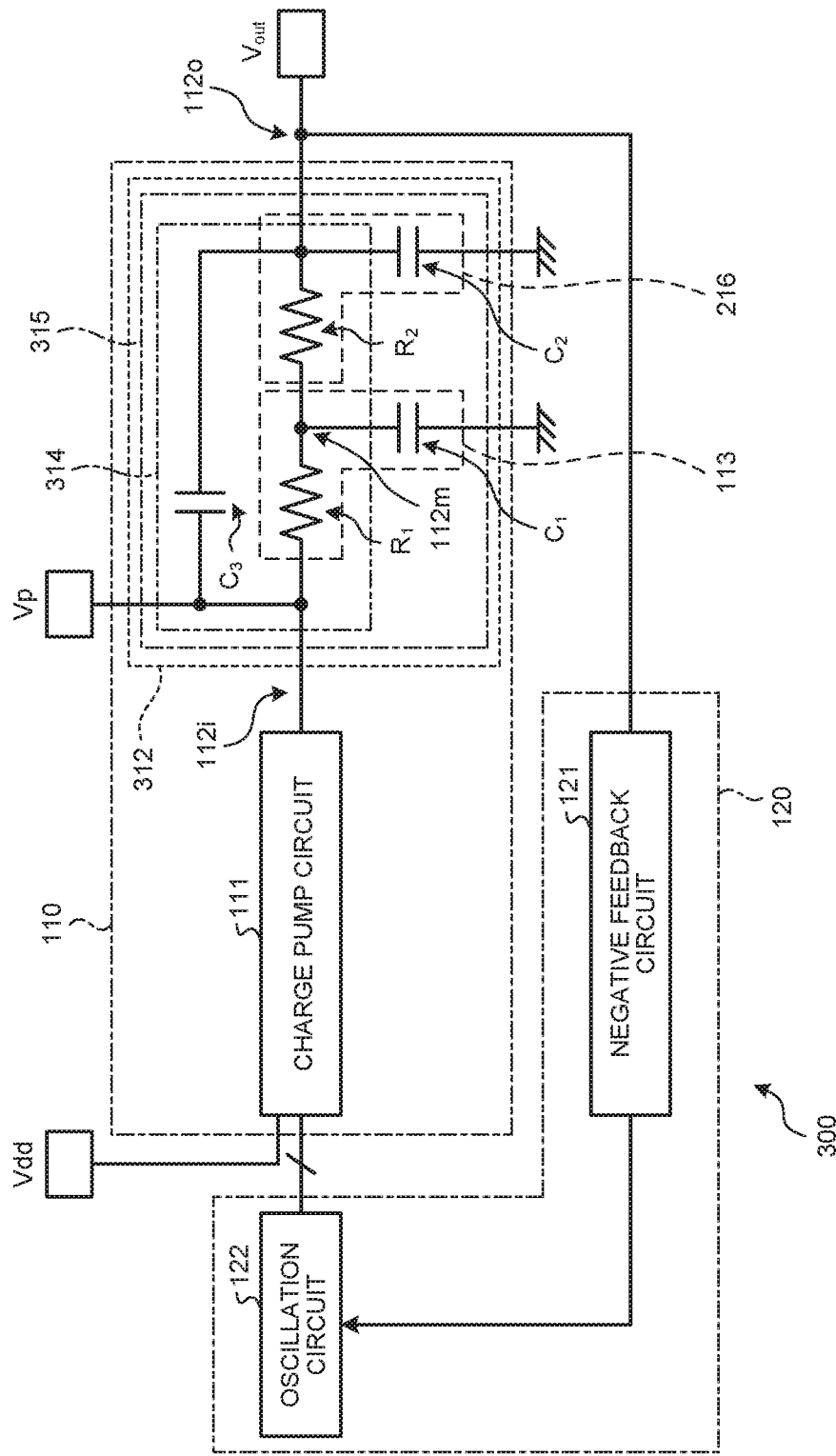
FIG. 9 is a circuit diagram illustrating a configuration of a semiconductor integrated circuit according to another Modified Example of the embodiment.

On the basis of the idea, the semiconductor integrated circuit 300 can be configured, for example, as illustrated in FIG. 9. FIG. 9 is a circuit diagram illustrating a configuration of the semiconductor integrated circuit 300 according to another Modified Example of the embodiment.

The semiconductor integrated circuit 300 illustrated in FIG. 9 has a filter circuit 312 instead of the filter circuit 112 (refer to FIG. 2). The filter circuit 312 is different in terms of the configuration of the zero point generation circuit. That is, the filter circuit 312 has a zero point generation circuit 314 and a pole generation circuit 315 instead of the zero point generation circuit 114 and the pole generation circuit 115 (refer to FIG. 2) and further has the low-pass filter 216.

The low-pass filter 216 is arranged between the low-pass filter 113 and the power supply output terminal TMout. The low-pass filter 216 has the resistive element $R_2$ and the capacitive element $C_2$. The resistive element $R_2$ is arranged between the low-pass filter 113 and the power supply output terminal TMout. One end of the resistive element $R_2$ is electrically connected to the other end of the resistive element $R_1$ and one end of the capacitive element $C_1$, and the other end of the resistive element $R_2$ is electrically connected to one end of the capacitive element $C_2$ and is electrically connected to the power supply output terminal TMout via the output node 112o.

The capacitive element $C_2$ is arranged between the resistive element $R_2$ and the power supply output terminal TMout. The capacitive element $C_2$ is shunt-connected to a path extending from, the input node 112i through the resistive elements $R_1$ and $R_2$ to the output node 112o. One end of the capacitive element $C_2$ is electrically connected to the other end of the resistive element $R_2$ and the output node 112o, and the other end of the capacitive element $C_2$ is electrically connected to the ground potential.

The zero point generation circuit 314 is arranged between the charge pump circuit 111 and the power supply output terminal TMout. The zero point generation circuit 314 has the resistive element (first resistive element) $R_1$, the resistive element (second resistive element) $R_2$, and the capacitive element (first capacitive element.) $C_3$. The pole generation circuit 315 has the resistive element $R_1$, the resistive element $R_2$, the capacitive element $C_3$, the capacitive element $C_1$, and the capacitive element $C_2$. The zero point generation circuit 314 and the pole generation circuit 315 share the resistive element $R_3$, the resistive element $R_2$, and the capacitive element $C_3$ with each other. The zero point generation circuit 314 shares the resistive element $R_1$ with the low-pass filter 113 and shares the resistive element $R_2$ with the low-pass filter 216. The pole generation circuit 315 includes low-pass filters 113 and 216.

The capacitive element $C_3$ is arranged in parallel to the series connection of the plurality of resistive elements $R_1$ and $R_2$ between the charge pump circuit 111 and the power supply output terminal TMout. The series connection of the plurality of resistive elements $R_1$ and $R_2$ and the capacitive element $C_3$ are connected in parallel to each other between the input node 112i and the intermediate node 112m. One end of the capacitive element $C_3$ is electrically connected to the charge pump circuit 111 via the input node 112i, and the other end of the capacitive element $C_3$ is electrically connected to the power supply output terminal TMout via the output node 112o.

More specifically, in a case where the parasitic capacitance in the load circuit 2 (refer to FIG. 1) and the parasitic resistance and the parasitic capacitance in the negative feedback circuit 121 can be neglected, the open-loop transfer function of the negative feedback loop of the charge pump circuit 111→the filter circuit 312→the negative feedback circuit 121→the oscillation circuit. 122→the charge pump circuit 111 can be expressed approximately by the following Mathematical Formula 11.

$$G(s) = \frac{C_3}{C_2 + C_3} \times \frac{s^2 + s\frac{C_3(R_1 + R_2)}{C_1 C_3 R_1 R_2} + \frac{1}{C_1 C_3 R_1 R_2}}{s^2 + s\frac{(C_2 + C_3)(R_1 + R_2)R_2 + C_1 R_1}{C_1(C_2 + C_3)R_1 R_2} + \frac{1}{C_1(C_2 + C_3)R_1 R_2}} \quad (11)$$

By inserting the variables $\alpha_1$ and $\beta_1$, expressed by the following Mathematical Formula 12 into Mathematical Formula 11, the frequencies $f_{z21}$ and $f_{z22}$ of the two zero points generated by the zero point generation circuit 314 can be expressed by the following Mathematical Formulas 13 and 14.

$$\alpha_1 = \frac{C_3(R_1 + R_2)}{C_1 C_3 R_1 R_2}, \beta_1 = \frac{1}{C_1 C_3 R_1 R_2} \quad (12)$$

$$f_{Z21} = \frac{1}{4\pi}\left[\alpha_1 + \sqrt{\alpha_1^2 - 4\beta_1}\right] \quad (13)$$

$$f_{Z22} = \frac{1}{4\pi}\left[\alpha_1 - \sqrt{\alpha_1^2 - 4\beta_1}\right] \quad (14)$$

In addition, by inserting the variables $\alpha_2$ and $\beta_2$ expressed by the following Mathematical Formula 15 into Mathematical Formula 11, the frequencies $f_{P21}$ and $f_{P22}$ of the two poles generated by the pole generation circuit 315 can be expressed by the following Mathematical Formulas 16 and 17, respectively.

$$\alpha_2 = \frac{(C_2 + C_3)(R_1 + R_2)R_2 + C_1 R_1}{C_1(C_2 + C_3)R_1 R_2}, \quad (15)$$

$$\beta_2 = \frac{1}{C_1(C_2 + C_3)R_1 R_2}$$

$$f_{P21} = \frac{1}{4\pi}\left[\alpha_2 + \sqrt{\alpha_2^2 - 4\beta_2}\right] \quad (16)$$

$$f_{P22} = \frac{1}{4\pi}\left[\alpha_2 - \sqrt{\alpha_2^2 - 4\beta_2}\right] \quad (17)$$

It can be understood from Mathematical Formula 13 that, by adjusting the capacitance value of the capacitive element $C_3$ without decreasing the resistance values of the resistive elements $R_1$ and $R_2$ or decreasing the capacitance value of the capacitive element C, the frequency $f_{z21}$ of the zero point can be located on the lower frequency side than the unity gain frequency $f_{UG}$. It can be understood from Mathematical Formula 14 that, by adjusting the capacitance value of the capacitive element $C_3$ without decreasing the resistance values of the resistive elements $R_1$ and $R_2$ or decreasing the capacitance value of the capacitive element $C_1$, the frequency $f_{z22}$ of the zero point can be located on the lower frequency side than the unity gain frequency $f_{UG}$. At this time, according to Mathematical Formulas 15 to 17, the frequencies $f_{P21}$ and $f_{P22}$ of the two poles are located on the lower frequency side than the frequencies $f_{z21}$ and $f_{z22}$ of the two zero points, respectively.

Figure 10A:
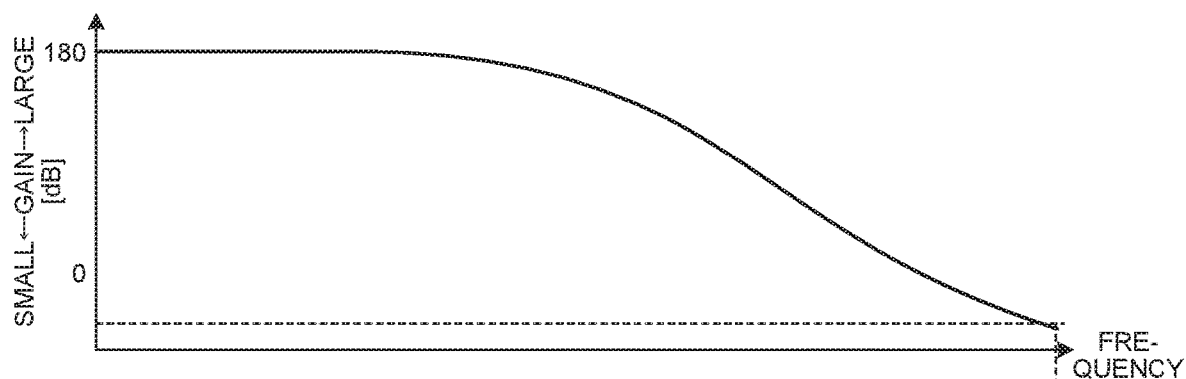
FIGS. 10A and 10B are diagrams illustrating open loop frequency characteristics of the semiconductor integrated circuit according to another Modified Example of the embodiment.
Figure 10B:
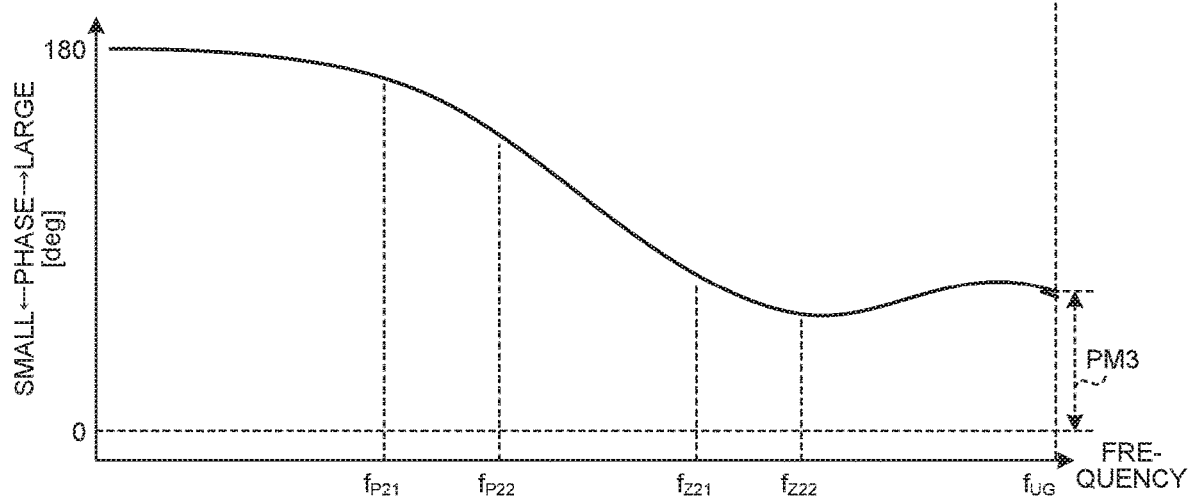

For example, the frequency characteristics of the semiconductor integrated circuit 300 are illustrated in FIG. 10. FIG. 10A illustrates the frequency characteristic of the gain of the semiconductor integrated circuit 300, and FIG. 10B illustrates the frequency characteristic of the phase of the semiconductor integrated circuit 300. In FIG. 10A, the vertical axis represents the magnitude of the gain [dB], and the horizontal axis represents the magnitude of the frequency in log scale. In FIG. 10B, the vertical axis represents the magnitude of the phase [deg] by arctan (Vout/Vin), and the horizontal axis represents the magnitude of the frequency in log scale.

The frequency at which the gain=0 [dB] in the frequency characteristic of the gain in FIG. 10A can be defined as a unity gain frequency $f_{UG}$. As illustrated in the frequency characteristic of the phase illustrated in FIG. 10B, the following relationship can be obtained.

Frequency of Pole $f_{P21}$<Frequency of Pole $f_{P22}$<Frequency of Zero Point $f_{z21}$<Frequency of Zero Point $f_{z22}$<Unity Gain Frequency $f_{UG}$ The frequency characteristic of the phase rotates to the minus side at the frequency $f_{P21}$ of the pole and further rotates to the minus side at the frequency $f_{P22}$ of the pole (the phase lags), and the frequency characteristic of the phase rotates to the plus side at the frequency $f_{z21}$ of the zero point and further rotates to the plus side at the frequency $f_{z22}$ of the zero point (the lagging of the phase is mitigated), so the phase margin PM3 at the unity gain frequency $f_{UG}$ can be allowed to be easily increased to a positive value (PM3>0). For example, in a case where $C_1$=5 [PF], $C_2$=50 [pF], $C_3$=2 [pF], $R_1$=20 [kΩ], and $R_2$=30 [kΩ], the phase margin PM3 becomes PM3≈+62.7 [deg].

As illustrated in FIGS. 10A and 10B, by generating a plurality (for example, two) of zero points to mitigate phase rotation by the poles, it is possible to further strengthen the effect of mitigating the leading of the phase. Therefore, the phase margin in the frequency characteristic of the semiconductor integrated circuit 300 can be further increased, and the negative feedback operation can be further stabilized. As a result, the design of the load circuit 2 connected to the power supply output terminal TMout of the semiconductor integrated circuit 300 can become more flexible.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fail within the scope and spirit of the inventions.

What is claimed is:

1. A semiconductor integrated circuit comprising:
    an oscillation circuit;
    a charge pump circuit arranged between each of a power supply input terminal and the oscillation circuit and a power supply output terminal;
    a smoothing circuit arranged between the charge pump circuit and the power supply output terminal; and
    a negative feedback circuit arranged on a path returning from the smoothing circuit to the oscillation circuit,
    wherein,
        the smoothing circuit includes a first zero point generation circuit, and
        the first zero point generation circuit includes:
            a first resistive element arranged between the charge pump circuit and the power supply output terminal; and
            a first capacitive element arranged in parallel to the first resistive element between the charge pump circuit and the power supply output terminal.

2. A semiconductor integrated circuit comprising:
    an oscillation circuit;
    a charge pump circuit arranged between each of a power supply input terminal and the oscillation circuit and a power supply output terminal;
    a smoothing circuit arranged between the charge pump circuit and the power supply output terminal; and
    a negative feedback circuit arranged on a path returning from the smoothing circuit to the oscillation circuit,
    wherein, the smoothing circuit includes a first zero point generation circuit, and the first zero point generation circuit includes:
a first resistive element;
a second resistive element arranged between the first resistive element and the power supply output terminal; and
a first capacitive element arranged in parallel to the first resistive element and the second resistive element between the charge pump circuit and the power supply output terminal.

3. A semiconductor integrated circuit comprising:
an oscillation circuit;
a charge pump circuit arranged between each of a power supply input terminal and the oscillation circuit and a power supply output terminal;
a smoothing circuit arranged between the charge pump circuit and the power supply output terminal; and
a negative feedback circuit arranged on a path returning from the smoothing circuit to the oscillation circuit,
wherein,
the smoothing circuit includes a first zero point generation circuit, and
the smoothing circuit further includes a second zero point generation circuit arranged between the first zero point generation circuit and the power supply output terminal.

4. The semiconductor integrated circuit according to claim 1, wherein
the smoothing circuit further includes a second zero point generation circuit arranged between the first zero point generation circuit and the power supply output terminal.

5. The semiconductor integrated circuit according to claim 3, wherein
the second zero point generation circuit includes:
a second resistive element arranged between the first zero point generation circuit and the power supply output terminal; and
a second capacitive element arranged in parallel to the second resistive element between the first zero point generation circuit and the power supply output terminal.

6. The semiconductor integrated circuit according to claim 4, wherein
the second zero point generation circuit includes:
a second resistive element arranged between the first zero point generation circuit and the power supply output terminal; and
a second capacitive element arranged in parallel to the second resistive element between the first zero point generation circuit and the power supply output terminal.

* * * * *